United States Patent [19]

Jewell et al.

[11] Patent Number: 4,661,888
[45] Date of Patent: Apr. 28, 1987

[54] REMOVABLE MODULAR HOUSING FOR RF CIRCUITS

[75] Inventors: Michael B. Jewell, Spokane, Wash.; Mark W. Johnson, Arlington, Va.; Arthur F. Upham, Spokane, Wash.

[73] Assignee: Hewlett-Packard Company, Palo Alto, Calif.

[21] Appl. No.: 627,590

[22] Filed: Jul. 3, 1984

[51] Int. Cl.⁴ .............................................. H05K 5/04
[52] U.S. Cl. ................................ 361/424; 174/35 GC; 174/35 R; 361/383
[58] Field of Search ................ 174/35 R, 35 GC, 51; 361/395, 383, 399, 424, 414, 415

[56] References Cited

U.S. PATENT DOCUMENTS 3,654,379  4/1972  Rodgers ..................... 174/35 GC
4,404,617  9/1983  Ohyama et al. ............. 361/424

FOREIGN PATENT DOCUMENTS 2101811  1/1983  United Kingdom .......... 174/35 R

Primary Examiner—A. D. Pellinen
Assistant Examiner—Greg Thompson
Attorney, Agent, or Firm—Leslie G. Murray

[57] ABSTRACT

A removable modular housing for providing and maintaining electromagnetic shielding, produceability and servicability of circuits producing and sensitive to RF energy.

4 Claims, 5 Drawing Figures

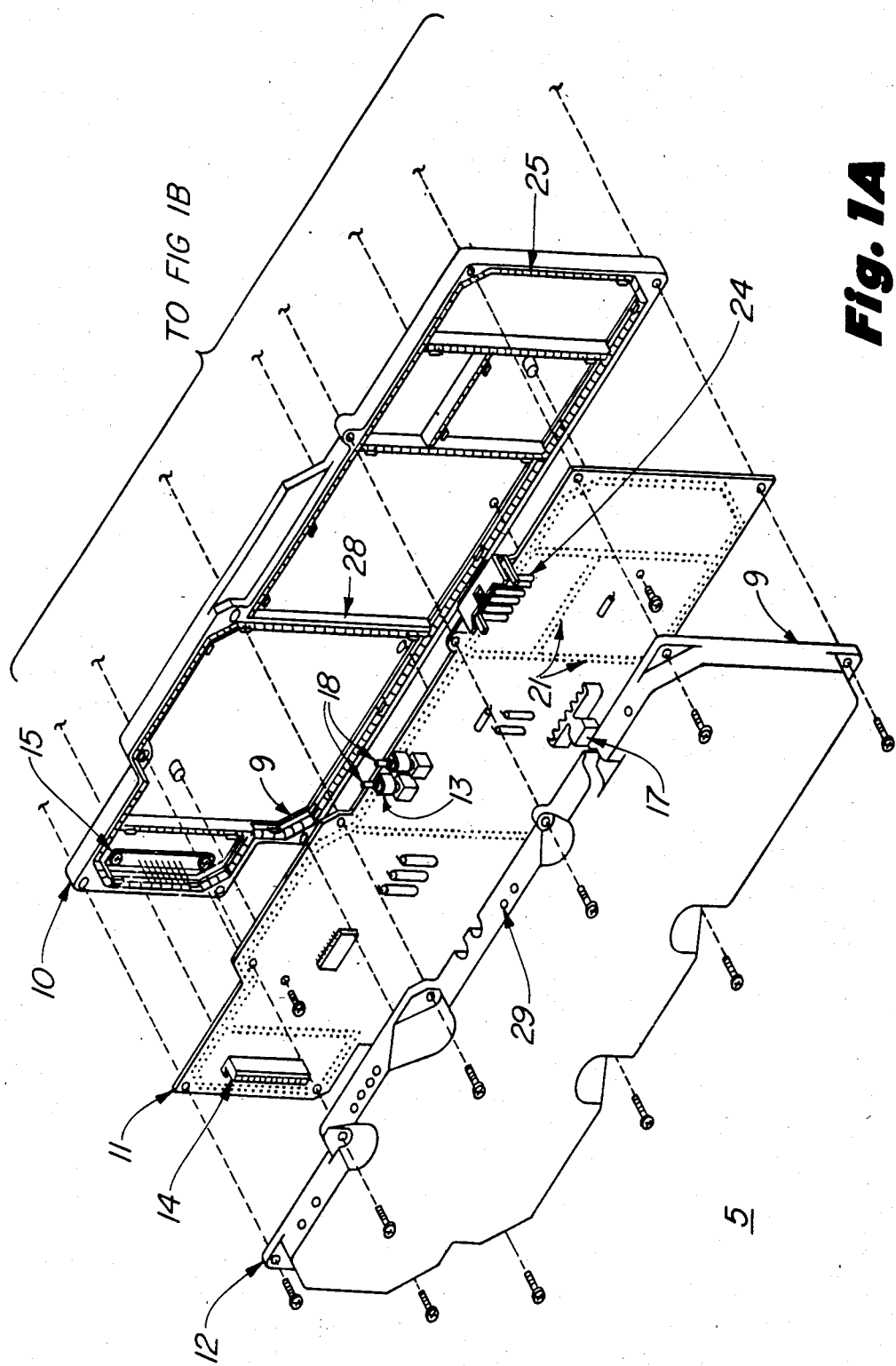

REMOVABLE MODULAR HOUSING FOR RF CIRCUITS

BACKGROUND AND SUMMARY

The present invention relates generally to radio frequency (RF) devices, and more particularly to removable electronic circuit modules in which mechanical support, RF shielding the grounding for one or more electronic circuits sensitive to or producing RF signals disposed within are provided.

In the past, electronic instrumentation involving RF circuits have been difficult to repair and service as well as assemble, test and calibrate, because of the interference such operations have on circuit performance. Even where a RF circuit is malfunctioning, repair is difficult because shielding, configuration and calibration of critical components are usually disturbed even while the malfunction is being diagnosed. Thus, such circuit repair often becomes an inconvenient series of trail and error steps involving repeated assembly and disassembly of the circuit components until repaired. Servicing, often merely calibration of instrumentation circuits, may also disturb shielding and configuration of a circuit which, in turn causes an inconvenient iteration of adjustments and component settings.

Typically, RF circuits in electronic instrumentation are isolated by shielding and ground planes from low frequency circuits. However, such RF circuits, which usually include many feedback loops and which often radiate spurious emissions, are often inter-related and therefore not isolated from each other.

RF instrumentation constructed according to the principles of the present invention have all circuits, especially those operating at high frequencies, divided into functional modules. Each module is a section of the instrument taken as a whole, amounting to a subsystem of the instrument, having well defined input and output specifications. Each module has a minimized number of interconnections to other modules of the instrument including, for example, connections for power, digital control and RF signals. Thus, each module contains circuitry which is separately assembled and tested prior to final assembly of the instrument.

Final assembly, test and calibration of a new instrument is greatly facilitated by modularizing according to the present invention. Rapid, on-site field repair of instrumentation such as RF signal generators and analyzers, is now a reality; even if repair of the module itself is not possible, instrument operation can be quickly restored by simply replacing the malfunctioning module. Field servicing is also easy, since separate calibration of each module, none of which interact with other modules while being calibrated, substantially calibrates the whole instrument.

Modules of the present invention include a cast aluminum base having up to two mounting surfaces for mounting electronic circuitry substrates such as printed circuit boards. Each mounting surface may accommodate more than one substrate. The substrates are then each sandwiched between the base and a cast aluminum cover. High frequency gasket material, affixed to the aluminum castings, contact ground plane areas of the printed circuit boards to electrically seal each module. Ground plane areas on the circuit boards extend to the edges thereof and between sections of circuitry requiring shielding from each other thereon. Such ground plane areas incorporate closely spaced, plated-through holes which form a continuous ground plane on both sides of the printed circuit board. All connectors and feed-through filters mounted on the printed circuit boards are grounded to the covers by conductive elastomer grommets.

According to the present invention, the modules are fitted with brackets at each end which slide over corresponding chassis guides mounted on the instrument chassis. Snap fasteners lock each bracket to its respective chassis guide to secure the module in its place in the instrument chassis.

The chassis guides are threaded to receive extension guides which also accept the corresponding snap fastener on each module bracket to lock the module in a servicing position external of the instrument chassis. When the module is in the servicing position, the covers may be removed and the circuits examined while power is applied. The printed circuit boards may also be removed for repair.

DESCRIPTION OF THE DRAWING

FIGS. 1A and 1B are exploded, perspective view illustrating a module for housing RF circuits constructed according to the principles of the present invention.

DESCRIPTION OF THE PREFERRED EMBODIMENT

Figure 1B:
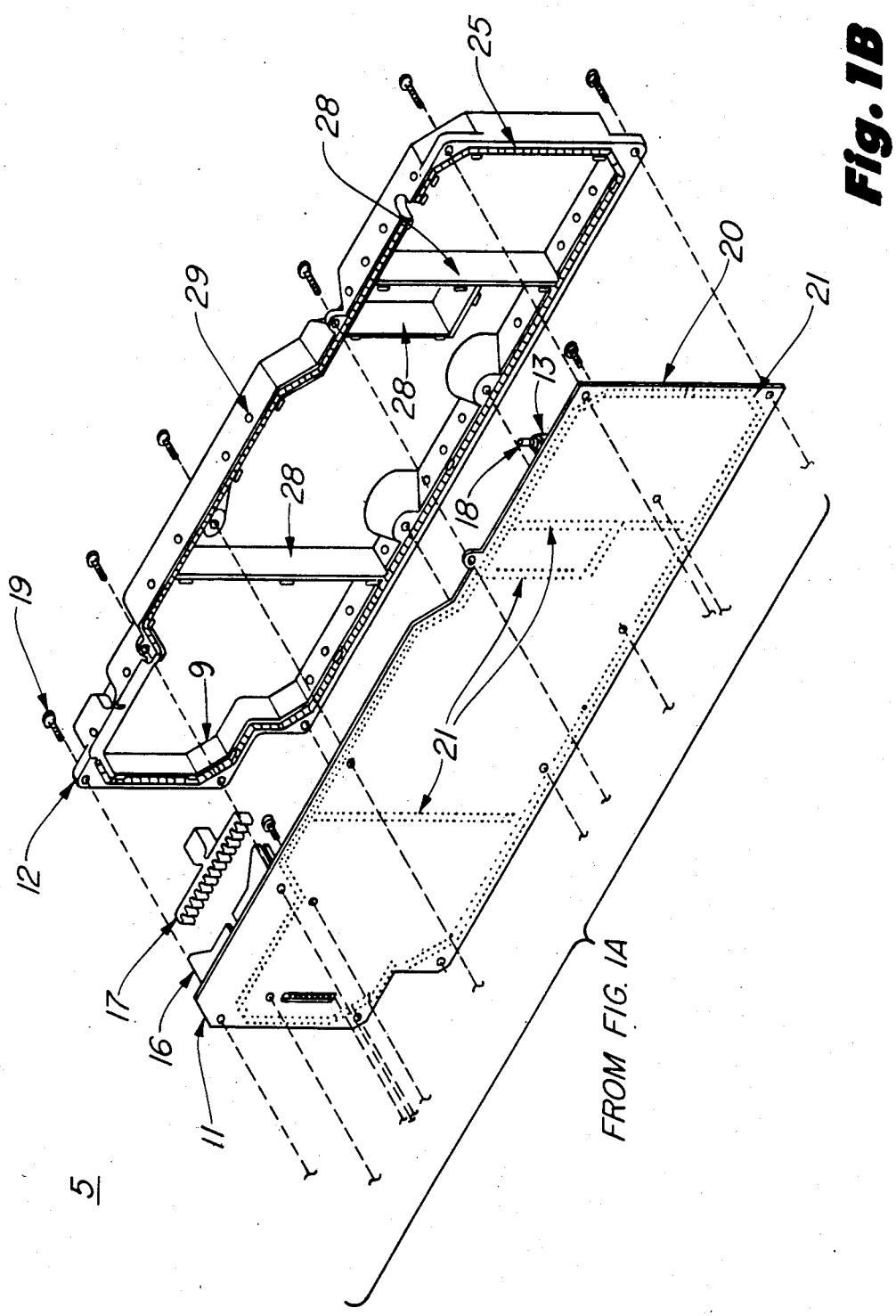

Referring to FIG. 1, the module 5 for housing RF circuits according to the present invention, comprises base plate 10 to which printed circuit boards 11 are mounted and covers 12, which mounted to base 10 over circuit boards 11 by machine screws 19.

Connectors 18 for receiving RF signal conductors are mounted on printed circuit boards 11. Conductive elastomer grommets 13 electrically seal the connectors by grounding the outer barrels thereof to ground planes 21 on the printed boards 11 and to covers 12, which are contoured to conform with the location of the connectors 18.

Printed circuit boards 11 are interconnected by feed-through filter connectors 14 via feed-through filters 15. Similarly, feed-through filters 24 and flat cable connectors 16 are sealed electrically by conductive elastomer gaskets 17 which are molded to conform to the contours of the feed-throughs 24 and connectors 16.

Printed circuit boards 11 incorporate predefined areas on both sides having electrically conductive surfaces which are used as a common reference point for circuit returns and signal potentials forming ground planes 21. Ground planes 21 may extend to and along the periphery or edges of printed circuit boards 11 and have plated-through holes 20 disposed therein electrically connecting the electrically conductive surfaces on both sides of printed circuit boards 11 to form a continuous ground plane 21 along the peripheral of the printed circuit boards. Similarly, such ground planes 21 and plated-through holes 20 are used to form internal ground planes 21 to shield sections of the printed circuit boards 11 from each other. Base 10 and covers 12 incorporate peripheral walls 9 which, when assembled (as shown in FIGS. 1A and 1B), contact the peripheral ground plane 21 and completely enclose and shield the circuitry mounted on printed circuit boards 11. Further, base 10 and covers 12 incorporate internal shielding walls 28 which conform to the pattern of the ground planes 21 dividing the circuitry on printed circuit boards 11 into sections, thus completely shielding one section of the circuitry from the spurious and conducted emissions of another.

Figure 2:
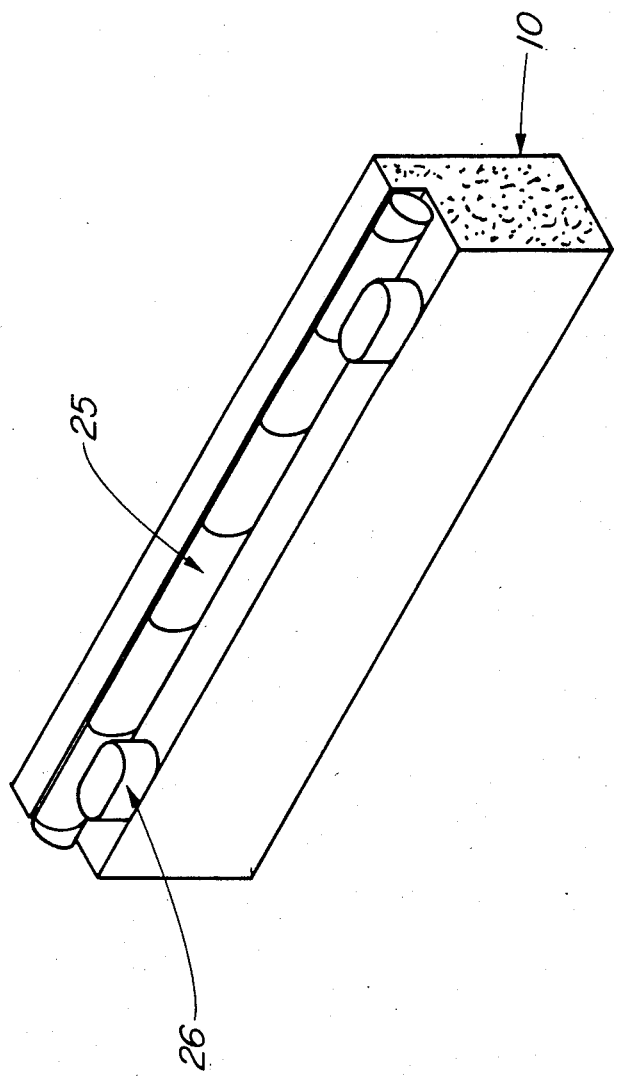
FIG. 2 is a perspective view of a portion of a cover, showing high frequency gasket material attached thereto, for the module shown in FIGS. 1A and 1B.

In FIG. 2, high frequency gasket 25 is typically affixed to base 10 and covers 12 by pinch bosses 26 disposed along the route of gasket 25. Any suitable method of attaching gasket 25 to the base and covers may be used so long as it remains flexible and resilient to assure good electrical contact for repeated disassembly and assembly operations. Gasket material 25 can be either spiral wound metal strip or extruded conductive elastomer.

Figure 3:
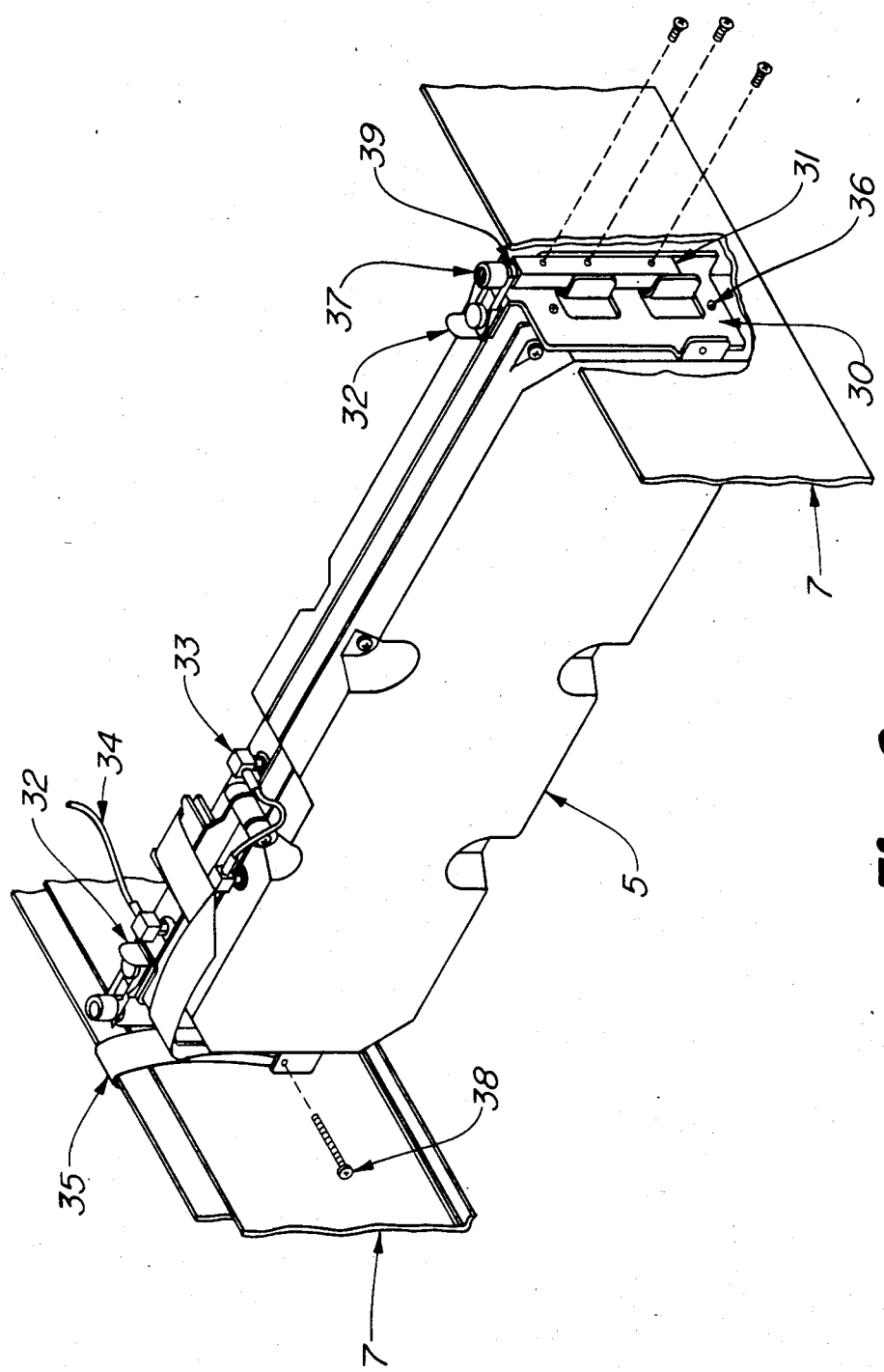
FIG. 3 is a perspective view of a fully assembled module shown in FIGS. 1A and 1B installed in an instrument chassis.

Module 5 is mounted in chassis 7 as shown in FIG. 3. Module brackets 30, attached by machine screws 36 to each end of module 5, slide over corresponding chassis guides 31 mounted on chassis 7 to locate the module 5 in place. Snap fasteners 32 secure module 5 in operating position by locking brackets 30 to corresponding chassis guides 31 as shown. Chassis guides 31 include internally threaded extension mounts 37.

Cable 34 connects signals requiring shielding to module 5 from either another module or from some source external of the instrument (not shown). Cable 33 couples signals from one printed circuit board on one side of the module to the other printed circuit board on the other side. Flat cable 35, held in place by cable pin 38, conducts power and control signals to module 5 from their source elsewhere in the instrument. Feed-through filters 15, shown in FIGS. 1A and 1B, conduct power and control signals from one printed circuit board to the other.

Figure 4:
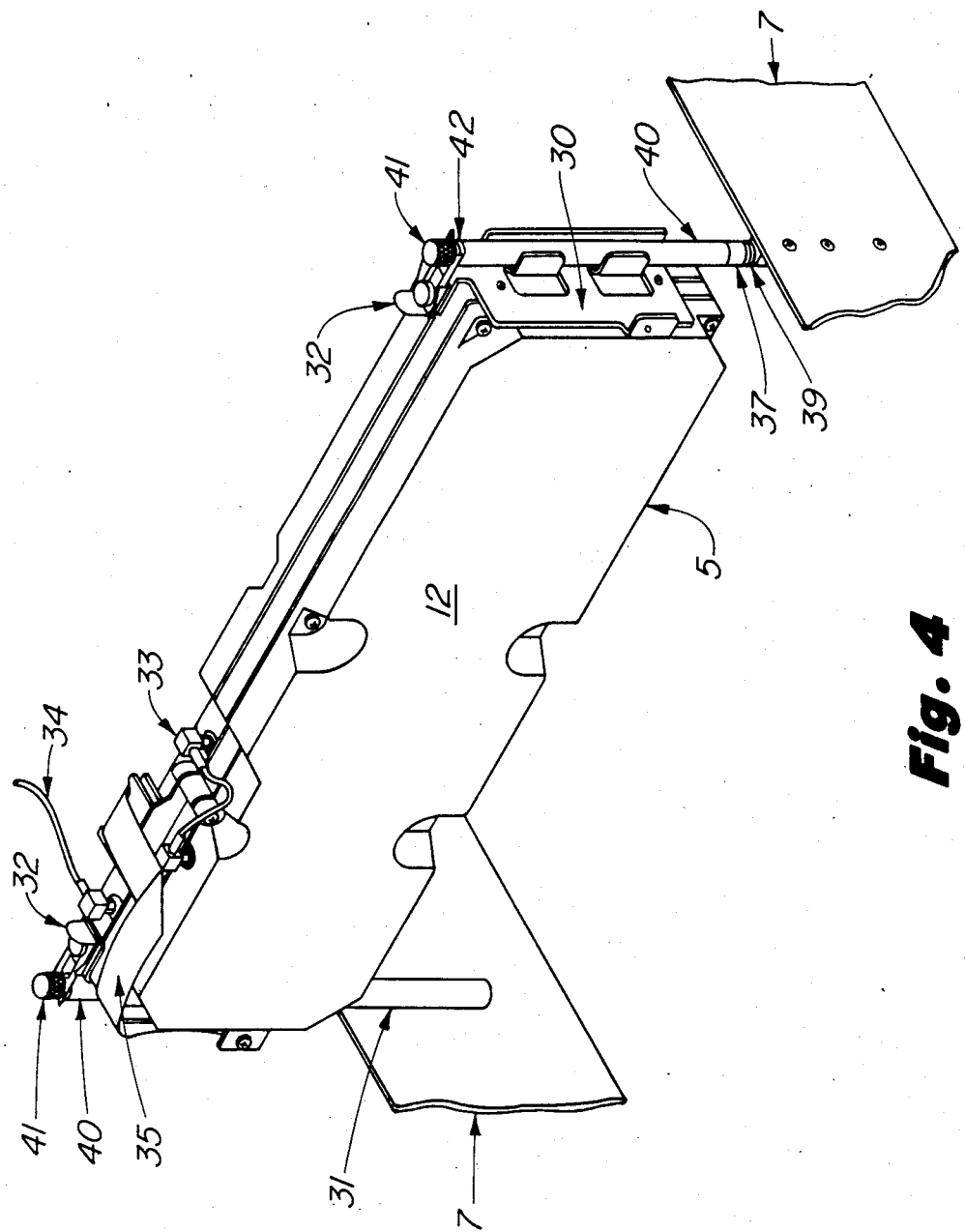
FIG. 4 is a perspective view of the module shown in FIG. 3 locked to extension guides in the servicing position according to the present invention.

Referring now to FIGS. 3 and 4, extension mount 37 comprises a short, hollow tube fixedly attached to the upper end of the chassis guide 31. The extension mount 37 is internally threaded for receiving the external guide 40. The extension mount 37 has an external circumferential groove 39 for receiving the snap fastener 32 which retains the module 5 in the operating position. External guide 40 is an extension or extender pin which is threaded at one end and has a knurled knob 41 at the other end. Similarly, adjacent to the knurled knob 41, the external guide 40 has a circumferential groove 42 for receiving the snap fastener 32.

To move the module 5 from the operating position (as shown in FIG. 3) to the servicing position (as shown in FIG. 4), an extension pin (external guide 40) is screwed into the extension mount 37 at each end of module 5. Snap fasteners 32 are then disconnected and the module 5 is pulled up on the external guides 40. The snap fasteners 32 are then reconnected in the groove 42 at the upper end of each of the external guides 40 to retain the module 5 in place while servicing. When servicing of the module 5 is completed, the procedure is reversed, and the external guides 40 removed.

Referring to FIG. 4, module 5 is shown in the servicing position external of chassis 7. Cables 33, 34 and 35 need not be disconnected while covers 12 are being removed, since connectors 16 and 18 (as shown in FIGS. 1A and 1B) are separately mounted and grounded to their respective printed circuit boards, and covers 12 are contoured to fit around each connector. In this position, module 5 can be fully operating with covers 12 removed for trouble-shooting and servicing while maintaining shielding of circuits in other modules to RF energy.

Cooling of circuit components in module 5 is achieved by drawing air through ventilation holes 29 as shown in FIGS. 1A and 1B. In addition to shielding, internal shielding walls 28 also may be used for directing air flow within module 5. Finally, since base 10 and covers 12 are aluminum having desirably high thermal conductivity, temperatures within module 5 tend to be relatively uniform, even though power dissipation may be concentrated in certain sections of the module. Of course, the number and location of ventilation holes 29, as well as the configuration of the internal shielding walls 28 can be tailored to meet the cooling requirements of each module.

Referring again to FIGS. 1A and 1B, plated-through holes 20 are obtained by well-known printed circuit board production technology. Alternatively, though less reliable, ground plane areas on both sides of the printed circuit boards may be connected by plating the edges of the printed boards.

Base 10 and covers 12 may be either machined parts or castings, thus facilitating virtually any suitable shape, size and convenient placement of internal shielding walls, ventilation and mounting hardware holes.

We claim:

1. A module housing and shielding electronic circuitry sensitive to or radiating RF energy, said module comprising:

a base plate having front and rear faces and two ends, the base plate including a periphery wall having two edges, one of the edges forming a continuous mounting surface about the periphery of the base plate in the plane of the front face and the other of the edges forming a continuous mounting surface about the periphery of the base plate in the plane of the rear face, the periphery wall having a preselected size and shape;

at least one electronic circuit substrate having a front side and a back side, the electronic circuitry disposed on the front and back sides thereof, the electronic circuit substrate having electrically conductive common areas disposed on the front and back sides in a predetermined pattern forming a continuous ground plate which divides the electronic circuitry into sections and extends to and along the periphery of the electronic circuit substrate adjacent the electronic circuitry, the electronic circuit substrate removably mounted on the base plate;

at least one cover covering and shielding the electronic circuitry, the cover, the electronic circuit substrate and the base plate shaped to be substantially congruent with respect to the shape and size of their periphery, the cover and the base plate including internal shielding walls, the internal walls shaped to conform to the pattern of the ground plane dividing the electronic circuitry into sections, the cover removably mounted to the base plate enclosing the electronic circuitry;

the mounting surface of the base in touch contact with the front side of the electronic circuit substrate near the periphery thereof and the cover in touch contact with the back side of the electronic circuit substrate near the periphery thereof, the internal walls in touch contact with the ground plane dividing the electronic circuitry into sections shielding one section of the electronic circuitry from another section of the electronic circuitry; and the base plate and the cover including electrically conductive material disposed along the periphery and internal walls contacting the ground plane and preventing spurious and conducted RF energy from affecting operation of the electronic circuitry and from being emitted from the module.

2. The module as in claim 1 further comprising a module bracket fixedly attached at each end of the module, said module brackets removably mounting the module in a chassis.

3. The module as in claim 2 wherein each module bracket includes a removable extension pin for slideably positioning the module from an installed position within the chassis to a servicing position external to the chassis.

4. The module as in claim 3 wherein said electronic circuit substrate includes holes disposed in the electrically conductive common areas, the holes extending through the electronic circuit substrate having their walls coated with an electrically conductive material, the holes electrically connecting the electrically conductive common areas on the front side of the electronic circuit substrate with the electrically conductive common areas on the backside of the electronic substrate forming a continuous ground plane.

* * * * *